US012693345B2

(12) United States Patent
Braun et al.

(10) Patent No.: US 12,693,345 B2
(45) Date of Patent: Jul. 28, 2026

(54) METHOD FOR DETERMINING THE STATE OF HEALTH OF A RECHARGEABLE BATTERY

(71) Applicant: Hilti Aktiengesellschaft, Schaan (LI)

(72) Inventors: Philipp Braun, Kaufbeuren (DE); Moses Ender, Buchs (CH); Robert Stanger, Kaufbeuren (DE)

(73) Assignee: Hilti Aktiengesellschaft, Schaan (LI)

( * ) Notice: Subject to any disclaimer, the term of this patent is extended or adjusted under 35 U.S.C. 154(b) by 117 days.

(21) Appl. No.: 18/681,779

(22) PCT Filed: Aug. 3, 2022

(86) PCT No.: PCT/EP2022/071790
§ 371 (c)(1),
(2) Date: Feb. 6, 2024

(87) PCT Pub. No.: WO2023/020840
PCT Pub. Date: Feb. 23, 2023

(65) Prior Publication Data
US 2024/0337702 A1 Oct. 10, 2024

(30) Foreign Application Priority Data
Aug. 20, 2021 (EP) ..................................... 21192300

(51) Int. Cl.
*G01R 31/392* (2019.01)
*G01R 31/3842* (2019.01)
(Continued)

(52) U.S. Cl.
CPC ....... *G01R 31/392* (2019.01); *G01R 31/3842* (2019.01); *G01R 31/389* (2019.01); *H02J 7/84* (2026.01)

(58) Field of Classification Search
None
See application file for complete search history.

(56) References Cited

U.S. PATENT DOCUMENTS 5,541,490 A 7/1996 Sengupta et al.
2016/0311094 A1* 10/2016 Mergener ............ B25B 23/1475
(Continued)

FOREIGN PATENT DOCUMENTS

CN 109932661 A 6/2019
DE 102018220251 A1 5/2020
(Continued)

OTHER PUBLICATIONS

International Search Report PCT/EP2022/071790 dated Nov. 16, 2022.

*Primary Examiner* — Jas A Sanghera
(74) *Attorney, Agent, or Firm* — Davidson Kappel LLC

(57) ABSTRACT
A method includes adjusting a rechargeable battery from a first state of charge to a second state of charge; creating a first current intensity value after a first predetermined time duration has elapsed, after a predetermined temperature value has been reached, after a predetermined current intensity value has been reached, or if the difference between a first and a second ascertained current intensity value reaches a predetermined threshold value; ascertaining a first voltage value after the first current intensity value has been reached; adjusting a second current intensity value after a second predetermined time duration has elapsed; ascertaining a second voltage value after the second current intensity value has been reached; and determining a first impedance value of the rechargeable battery from the quotient of the difference between the first and second current intensity values and the difference between the first and second voltage values. Rechargeable battery and charger for carrying out the method.

11 Claims, 5 Drawing Sheets

(51) Int. Cl.
  *G01R 31/389*        (2019.01)
  *H02J 7/84*          (2026.01)

(56)                References Cited

U.S. PATENT DOCUMENTS

2019/0178950  A1     6/2019  Wu et al.
2022/0057453  A1*    2/2022  Nicklaus ............. H02J 7/00034
2022/0344960  A1    10/2022  Mayer et al.
2023/0288488  A1*    9/2023  Hattori ............... G01R 31/3842

FOREIGN PATENT DOCUMENTS

DE      102019000754  A1     8/2020
JP          2005341759  A    12/2005
JP          2005341760  A    12/2005
WO      WO 2021063740  A1     4/2021
WO      WO2023/020841  A     2/2023

* cited by examiner

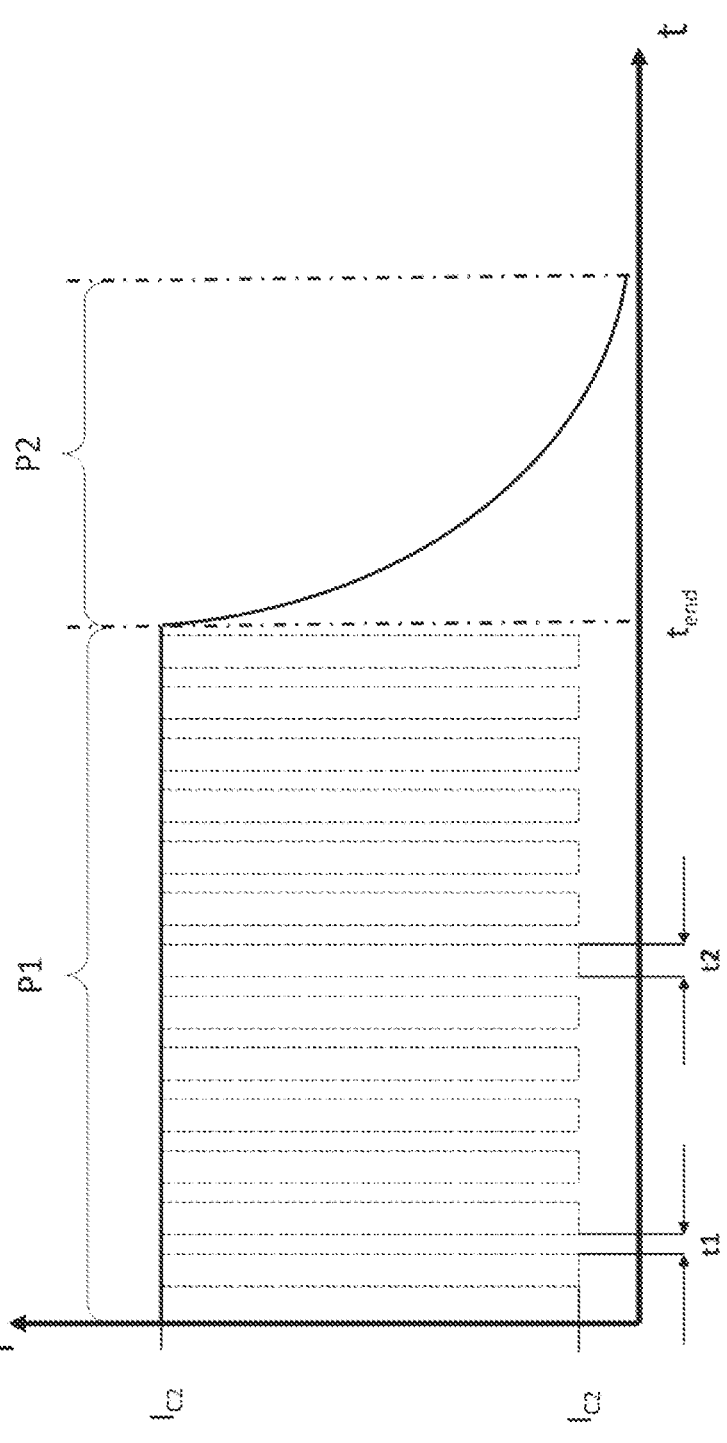
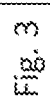

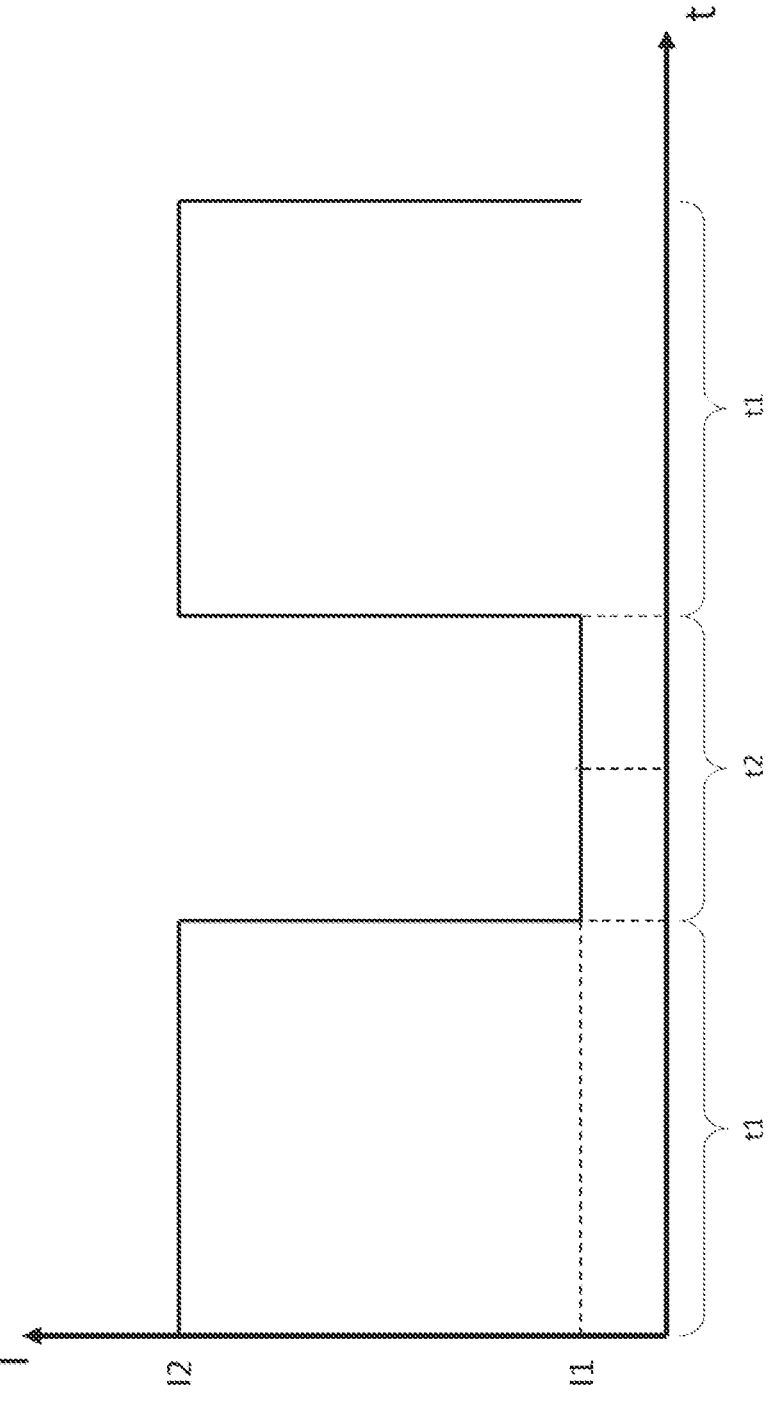
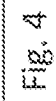

METHOD FOR DETERMINING THE STATE OF HEALTH OF A RECHARGEABLE BATTERY

The present invention relates to a method for open-loop and closed-loop control of a rechargeable battery for supplying a power tool with electrical energy, the rechargeable battery containing at least one energy storage cell, at least one temperature sensor, a current measuring device, a voltage measuring device and also a rechargeable battery control device having at least one rechargeable battery storage device.

Furthermore, the present invention relates to a rechargeable battery for carrying out the method.

Moreover, the present invention relates to a charger for carrying out the method.

BACKGROUND

Rechargeable batteries are often used for supplying various apparatuses or machines with electrical energy. The use of rechargeable batteries for supplying power tools, such as e.g. drills, hammer drills, saws, grinders, screwdrivers or the like, is likewise very widely known. Rechargeable batteries usually have a multiplicity of energy storage cells (also called cells or rechargeable battery cells) for storing or providing the electrical energy. In this case, the technology of the energy storage cells may be based e.g. on Li-ion, Li-polymer, Li-metal, Ni—Cd, Ni-MH or the like.

The capacity or the actual performance of the energy storage cells may change or decrease over the lifetime of the rechargeable battery as a result of various ageing mechanisms. A rechargeable battery typically loses capacity and performance over the course of its life cycle; this loss has a direct influence on the so-called "state of health" of the rechargeable battery. The acute state of health of a rechargeable battery is often also abbreviated to SOH.

SUMMARY OF THE INVENTION

It is necessary to correctly or accurately determine the actual capacity or the SOH of a rechargeable battery in order to be able to ascertain the exact period of use or the remaining possibility for using a rechargeable battery as energy supply. Inaccurate indications regarding the capacity or performance of a rechargeable battery may cause a user to assume a much higher (remaining) capacity or performance of a rechargeable battery than is actually available. Using rechargeable batteries with an unexpected excessively low (remaining) capacity or performance may cause the deployment for example of a rechargeable battery-operated power tool to become discontinuous and the use thereof accordingly to become inefficient.

It is likewise necessary to correctly or accurately determine the actual capacity or the SOH of a rechargeable battery in order, for rapid and effective charging of the rechargeable battery, to be able to determine the necessary charging quantity of electrical energy and also the actual charging time when the rechargeable battery is charged by a charger.

It is an object of the present invention to solve the abovementioned problem and to provide a method for open-loop and closed-loop control of a rechargeable battery which makes it possible to ensure that the capacity or performance of a rechargeable battery is determined as accurately as possible. Furthermore, it is also an object to provide a rechargeable battery and also a charger for carrying out the method which make it possible to ensure that the capacity or performance of a rechargeable battery is determined as accurately as possible.

The present invention provides a method for open-loop and closed-loop control of a rechargeable battery for supplying a power tool with electrical energy, the rechargeable battery containing at least one energy storage cell, at least one temperature sensor, a current measuring device, a voltage measuring device and also a rechargeable battery control device having at least one rechargeable battery storage device.

According to the invention, the method comprises the method steps of:

adjusting the rechargeable battery from a first state of charge to a second state of charge;

creating a first current intensity value after a first predetermined time duration has elapsed, after a predetermined temperature value has been reached, after a predetermined current intensity value has been reached, or if the difference between a first and a second ascertained current intensity value reaches a predetermined threshold value;

ascertaining a first voltage value after the first current intensity value has been reached;

adjusting a second current intensity value after a second predetermined time duration has elapsed;

ascertaining a second voltage value after the second current intensity value has been reached; and determining a first impedance value of the rechargeable battery from the quotient of the difference between the first and second current intensity values and the difference between the first and second voltage values.

By virtue of the fact that the impedance or the internal resistance of the rechargeable battery is directly related to the capacity and performance of the rechargeable battery, the actual capacity and performance of the rechargeable battery can be determined by way of the ascertained impedance or internal resistance value. The higher the impedance or the internal resistance of the rechargeable battery, the lower the capacity and performance of the rechargeable battery. The actual capacity and performance of the rechargeable battery may also be referred to as the state of health (SoH) of the rechargeable battery.

The method step of adjusting the rechargeable battery from a first state of charge to a second state of charge can be either a charging process, in which electrical energy passes from a charger to the rechargeable battery, or a discharging process, in which electrical energy passes from the rechargeable battery to a power tool.

In accordance with one advantageous embodiment of the present invention, it may be possible for the first voltage value to be ascertained after a third predetermined time duration has elapsed after the first current intensity value has been reached. The third predetermined time duration is between 1 and 5 seconds, in particular 3 seconds, and serves for relaxation and thus for a more accurate determination of the rechargeable battery or cell voltage.

The specific voltage of the rechargeable battery, i.e. the maximum, nominal or minimum voltage, results from the respective rechargeable battery cell technology and also from the number of rechargeable battery cells connected in series in the interior of the rechargeable battery.

The capacity is typically specified or measured in ampere-hours (Ah) and denotes the electrical charge that the rechargeable battery can contain. It is calculated from the capacity of a single rechargeable battery cell and from the number of rechargeable battery cells connected in parallel in the rechargeable battery. For a given rechargeable battery voltage, a higher capacity here means that the rechargeable battery can store more energy.

The maximum current that can be supplied by a rechargeable battery is specified, for example, in order to specify the performance of a rechargeable battery. Since the rechargeable battery cells heat up at high currents and are permitted to be operated only in a specific temperature range, the performance of the rechargeable battery may also be described by a current that the rechargeable battery can supply for a specific time or until complete discharge. The performance is very greatly dependent on the impedance (opposition to alternating current) of the rechargeable battery. The impedance may also be referred to as the internal resistance of the rechargeable battery cells or of the rechargeable battery.

Rechargeable batteries for supplying a power tool typically contain lithium-ion cells (Li-ion), which are charged with electrical energy by conventional chargers generally in a so-called CCCV method (Constant Current Constant Voltage). In this case, charging electronics of the charger generate a constant charging current through the rechargeable battery (Constant Current—CC), with the result that the rechargeable battery voltage rises. As soon as a maximum rechargeable battery voltage is reached, it is kept constant by the charging electronics (Constant Voltage—CV) and the charging current is correspondingly reduced. Once a predefined minimum value of the charging current has been reached, the charging electronics end the charging process and the rechargeable battery cells are fully charged. The transition from the CC phase to the CV phase typically takes place at a state of charge (i.e. capacity) of approximately 80%.

The rechargeable battery voltage of the rechargeable battery is generally a multiple of the voltage of a single rechargeable battery cell and results from the parallel or serial interconnection of the rechargeable battery cells. In the case of Li-ion rechargeable battery cells having a cell voltage of 3.6 V, exemplary rechargeable battery voltages of 3.6 V, 7.2 V, 10.8 V, 14.4 V, 18 V, 36 V, etc. thus result. Preferably, the rechargeable battery cell is embodied as an at least substantially cylindrical round cell, the cell terminals being arranged at ends of the cylinder shape. The electrical interface comprises in particular at least two electrical contact elements configured for transferring energy. Alternatively, however, the electrical interface can also have a secondary charging coil element for inductive charging.

In one particular embodiment of the invention, the charging process is carried out by means of the CCCV method, wherein the remaining capacity is determined by ascertaining the first charging value before the CC phase and the further charging values during the CC phase and the CV phase. Consequently, before the CC phase the open-circuit voltage is measured and afterward so-called "Coulomb Counting" is carried out, which detects the number of electrons for the purpose of determining the charge in the rechargeable battery.

The remaining performance of the rechargeable battery is preferably determined during the CC phase by the charging current being reduced from a first value to a second value after the predefined rechargeable battery voltage has been reached, for a specific time duration. In addition, the remaining performance of the rechargeable battery can be determined by a waiting time elapsing in each case after a change in the charging current until the rechargeable battery voltage is measured. Furthermore, provision is made for the determination of the remaining performance to be repeated at regular time intervals during the charging process, in particular during the CC phase.

The increase in the impedance over the course of time is an effect of the ageing of the rechargeable battery cells. By contrast, the impedance of the current-carrying elements (contacts, conductor tracks, cables, etc.) in the rechargeable battery or in the charger changes only negligibly. It is thus particularly advantageous to realize the voltage measurements directly in the rechargeable battery in order to ignore the impedances of the current-carrying elements. Either the voltage in the individual rechargeable battery cells or the voltage in the entire rechargeable battery can be ascertained. This impedance measurement can take place either once or repeatedly during the charging process. A plurality of measurements allow plausibilization and thus avoidance of measurement errors, but also a more precise and more detailed estimation.

The remaining capacity, the remaining performance and/or the state of health of the rechargeable battery can particularly advantageously be output on an external display unit. In this case, both a display (LCD, OLED, ePaper or the like) and an LED display of the rechargeable battery, of the charger or alternatively and/or supplementarily a smartphone, tablet, PC or the like can be used as the display unit. The communication between the rechargeable battery and the display units mentioned takes place via a corresponding communication interface. In this case, a proprietary BUS can be used, such as a transmission by way of standard protocols by cable or radio.

BRIEF DESCRIPTION OF THE DRAWINGS

Further advantages will become apparent from the following description of the figures. Various exemplary embodiments of the present invention are illustrated in the figures. The figures, the description and the claims contain numerous features in combination. A person skilled in the art will expediently also consider the features individually and combine them to form useful further combinations.

In the figures, identical components and components of identical type are designated by the same reference signs. In the figures:

FIG. 1*b* shows a sectional view through the rechargeable battery connected to a power tool;

FIG. 3 shows a graphical representation of a CCCV charging process; and

FIG. 4 shows a graphical representation for illustrating the determination of an impedance value of the rechargeable battery.

DETAILED DESCRIPTION

Figure 1A:
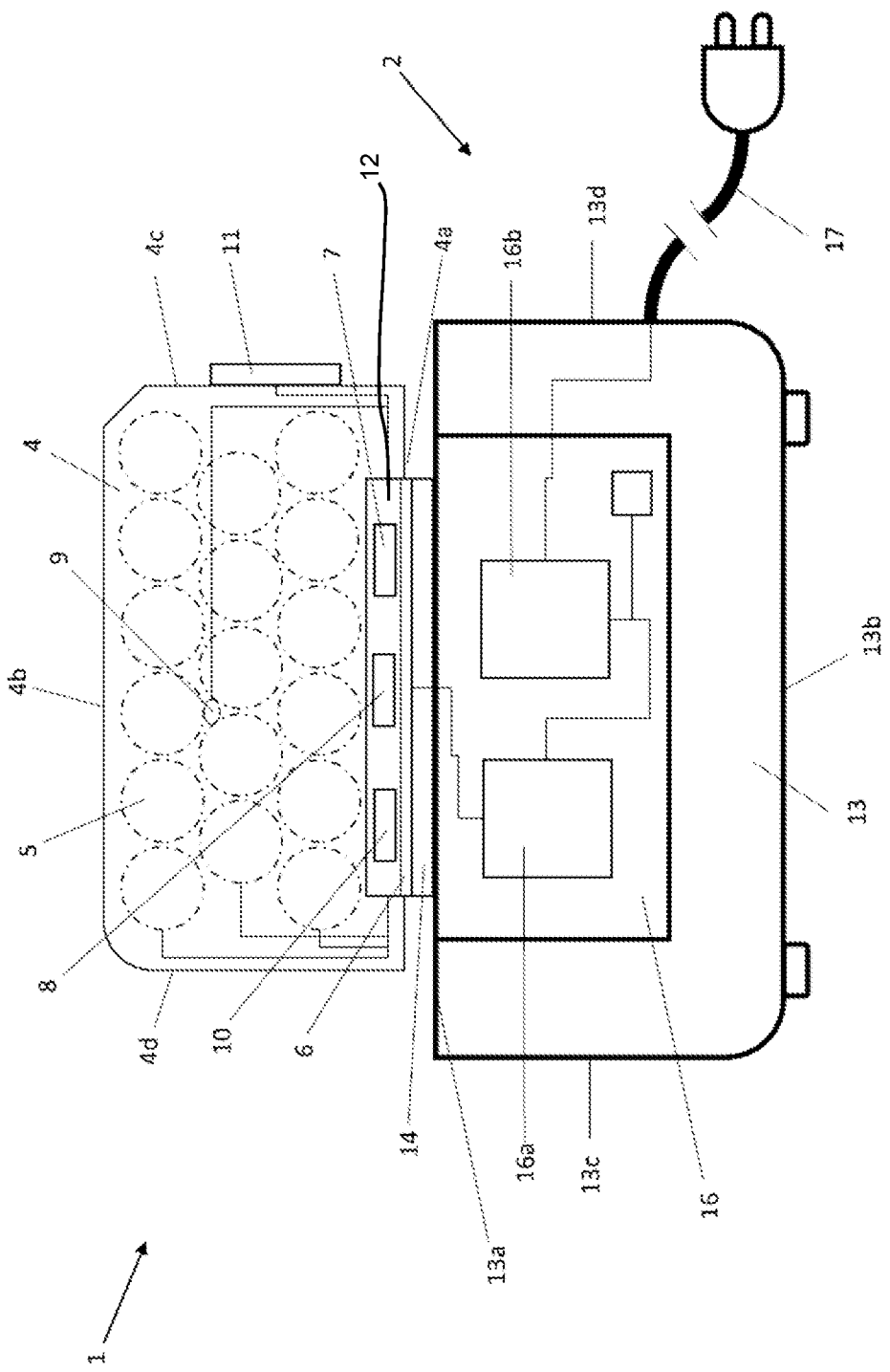
FIG. 1*a* shows a sectional view through a rechargeable battery connected to a charger.

FIG. 1*a* shows a rechargeable battery 1 releasably connected to a charger 2.

The rechargeable battery 1 can the used as an energy supply for a power tool 3. The power tool 3 is illustrated in the form of a rechargeable battery-operated screwdriver in FIG. 2.

The rechargeable battery 1 substantially contains a rechargeable battery housing 4, a number of energy storage cells 5, a rechargeable battery interface 6, a current measuring device 7, a voltage measuring device 8, a temperature sensor 9, a rechargeable battery storage device 10, a display and input device 11 and also a rechargeable battery control device 12.

The rechargeable battery housing 4 contains a top side 4a, an underside 4b, a left side wall, a right side wall, a front side 4c and a rear side. Only the top side 4a, the underside 4b, the front side 4c and the rear side 4d are shown in FIG. 1a.

The rechargeable battery interface 6 is positioned at the top side 4a of the rechargeable battery housing 4 and serves for releasably connecting the rechargeable battery 3 to the charger 2 or a power tool 3. For this purpose, the rechargeable battery interface 6 contains a mechanical coupling device, an electrical connection device and also a communication connection. Neither the mechanical coupling device nor the electrical connection device nor the communication connection is shown in the figures.

The mechanical coupling device, the electrical connection device and the communication connection of the rechargeable battery interface 6 is not shown in the figures.

By means of the mechanical coupling device, the rechargeable battery 1 can be connected either to the charger 2 or to a power tool 3 in a form- and force-fitting manner. By means of the electrical connection device, electrical energy can pass from the charger 2 to the rechargeable battery 1 when the rechargeable battery 1 is connected to the charger 2. Likewise, electrical energy can pass from the rechargeable battery 1 to a power tool 3 when the rechargeable battery 1 is connected to the power tool 3. The communication connection serves to enable the exchange of information and data in the form of signals between the rechargeable battery 1 and the charger 2 or between the rechargeable battery 1 and the power tool 3. The information and data can include, inter alia, charging or discharging parameters, temperature values, state of charge (SOC), the state of health (SOH), (remaining) capacity, voltage, current intensity or the like.

The rechargeable battery control device 12 is positioned substantially in proximity to the top side 4a of the rechargeable battery housing 4 and serves for open-loop and closed-loop control of the various functions of the rechargeable battery 1.

The energy storage cells 5 are positioned in three rows in the interior of the rechargeable battery housing 4, such that the temperature sensor 9 is positioned between the second and third rows of the energy storage cells 5. The temperature sensor 9 serves for detecting the temperature in the interior of the rechargeable battery 1 at one of the centrally positioned energy storage cells 5. The temperature sensor 9 is connected to the rechargeable battery control device 12 via a line. Since the energy storage cells 5 in the interior or in the center of the rechargeable battery 1 usually have the highest temperatures during the charging or discharging process, a temperature sensor 9 that detects the temperature at said centrally positioned energy storage cell 5 can establish the highest temperature and thus extremely rapidly a critically high temperature for the rechargeable battery 1.

Furthermore, the current measuring device 7, the voltage measuring device 8 and the rechargeable battery storage device 10 are contained within the rechargeable battery control device 12.

The current measuring device 7 serves for detecting or measuring the current intensity at the individual energy storage cells 5. As indicated in FIG. 1a, the current measuring device 7 is therefore connected to each individual energy storage cell 5. Detecting or measuring the current intensity at the individual energy storage cell 5 makes it possible to ascertain the current intensity for the entire rechargeable battery 1.

The voltage measuring device 8 serves for detecting or measuring the voltage at the individual energy storage cells 5. As indicated in FIG. 1a, the voltage measuring device 8 is therefore connected to each individual energy storage cell 5. Detecting or measuring the voltage at the individual energy storage cell 5 makes it possible to ascertain the voltage for the entire rechargeable battery 1.

The storage device 10 serves for storing and providing a wide variety of information and data, such as e.g. lookup tables for the various charging or discharging parameters of the rechargeable battery 1. These parameters include, inter alia, temperature profiles or threshold values for voltages or current intensities.

The display and input device 11, which may also be referred to as a human-machine interface (HMI), is positioned at the front side of the rechargeable battery housing 4. As indicated in FIG. 1a, the display and input device 11 is connected to the rechargeable battery control device 12, such that various data and items of information are discernible on a display portion of the display and input device 11. In particular, it is possible to display the state of charge or the capacity of the rechargeable battery 1 on the display portion.

It is possible for a user to select and adjust various operating states (alternatively called operating modes or modes) for the rechargeable battery 1 on an input portion of the display and input device 11. The various operating states include specific states of charge or discharge, for example. In a first selectable operating state, a CCCV charging method is set for the rechargeable battery 1. In a second selectable operating state, a rapid charging method is set for the rechargeable battery 1, in which method a relatively short charging time can be attained with relatively high charging currents. In a third selectable operating state, a slow and gentle charging method is set for the rechargeable battery 1, in which method a relatively long charging time but also charging that is gentle (i.e. not very burdensome) for the energy storage cells 5 can be attained with relatively low charging currents.

The charger 2 contains a charger housing 13, a charger interface 14, a charger storage device 15 and also a charger control device 16.

The charger control device 16 contains a current measuring device 16a and a voltage measuring device 16b.

The charger housing 13 contains a top side 13a, and underside 13b, a left side wall, a right side wall, a front side 13c and a rear side 13d. Only the top side 13a, the underside 13b, the front side 13c and the rear side 13d are shown in FIG. 1a.

The charger interface 14 is positioned at the top side 13a of the charger housing 13 and serves for releasably connecting the charger 2 to the rechargeable battery 1. For this purpose, the charger interface 14 contains a mechanical coupling device, an electrical connection device and also a communication connection.

The mechanical coupling device, the electrical connection device and the communication connection of the charger 2 are embodied in a manner corresponding to the mechanical coupling device, the electrical connection device and the communication connection of the rechargeable battery 1, such that the components of the charger interface 14 and of the rechargeable battery interface 6 can be correspondingly connected to one another.

The mechanical coupling device, the electrical connection device and the communication connection of the charger interface 14 are not shown in the figures.

Furthermore, the charger 2 has a power connection cable 17, which projects from the charger housing 14 and is connected to the charger control device 16. The power connection cable 17 serves for releasably connecting the charger 2 to a grid power source (power outlet).

FIG. 1*b* shows the rechargeable battery 1 releasably connected to the power tool 3. As already described above, the power tool 3 is embodied as a rechargeable battery-operated screwdriver in FIG. 2. Alternatively, the power tool 3 can also be embodied as a hammer drill, a drill, a saw, a grinder or the like. The power tool 3 embodied as a rechargeable battery-operated screwdriver substantially contains a housing 18, a handle 19 and also a tool fitting 20.

Figure 2:
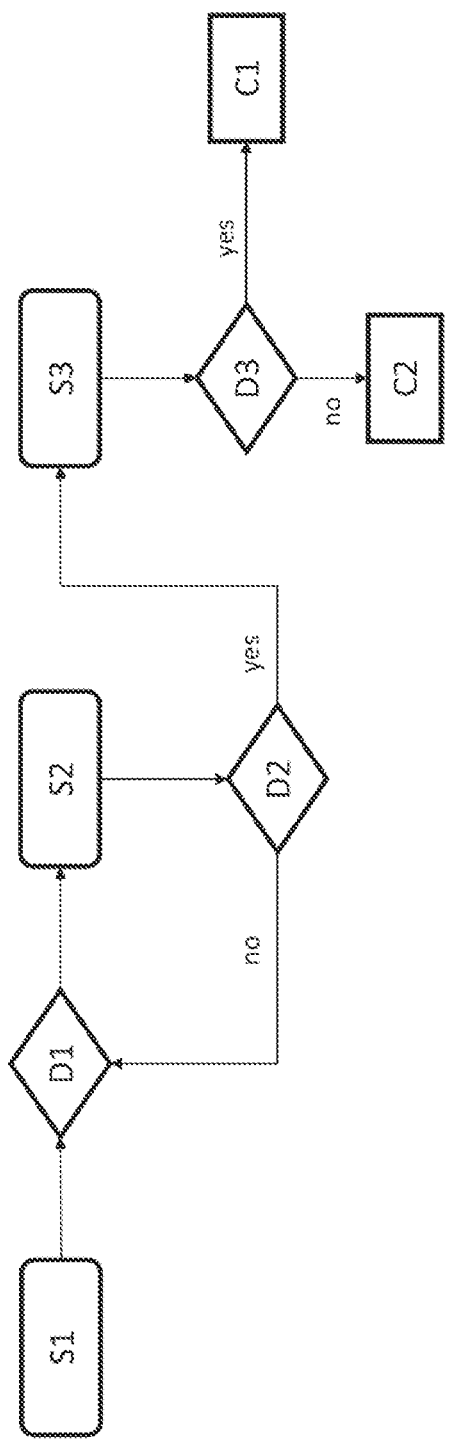
FIG. 2 shows a schematic diagram for illustrating the method for open-loop and closed-loop control of a rechargeable battery.
Figure 2:

The housing 18 of the power tool 2 in turn contains a top side 18*a*, an underside 18*b*, a front end 18*c* and a back end 18*d*. Substantially a drive 21, a transmission 22, an output shaft 23 and a control apparatus 24 are contained in the interior of the housing 18. The drive 21 is embodied as an electric motor and serves for generating a torque. As shown in FIG. 2, the drive 21, the transmission 22, the output shaft 23 and the tool fitting 20 are arranged relative to one another such that a torque generated by the drive 21 can be transmitted to the tool fitting 20 via the transmission 22 and the output shaft 23.

The tool fitting 20 serving for receiving and holding a tool 25 is positioned at the front end 18*c*. The tool 25 is a screwdriver bit.

The handle 19 allows the power tool 3 to be held and guided by a user (not shown). In this case, the handle 19 contains an upper end 19*a* and a lower end 19*b*. The handle 19 is secured by the upper end 19*a* to the underside 19*b* of the housing 19 of the power tool 2. A base apparatus 26 having a power tool interface 27 is positioned at the lower end 19*b* of the handle 19.

Furthermore, the handle 19 has an activation switch 28 connected to the control device 24. The activation switch 28 enables a user to put the power tool 2 into an activation state or a deactivation state depending on the positioning of the activation switch 28. In an activation state, the drive 21 generates a torque.

The power tool interface 27 serves for releasably connecting the power tool 3 to the rechargeable battery 1. For this purpose, the power tool interface 27 contains a mechanical coupling device, an electrical connection device and also a communication connection.

The mechanical coupling device, the electrical connection device and the communication connection of the power tool 3 are embodied in a manner corresponding to the mechanical coupling device, the electrical connection device and the communication connection of the rechargeable battery 1, such that the components of the power tool 3 and of the rechargeable battery interface 6 can be correspondingly connected to one another.

The mechanical coupling device, the electrical connection device and the communication connection of the power tool 3 are not shown in the figures.

FIG. 3 shows a graphical representation of a CCCV charge process, the charger 2 providing a constant charging current (CC—constant current) $I_{C2}$ in the phase P1 until a maximum rechargeable battery voltage has been reached. Starting from a point in time $t_{end}$ the value of the charging current $I_{C2}$ is continuously reduced during a second phase P2, the rechargeable battery voltage remaining constant (CV—constant voltage).

FIG. 2 shows a schematic diagram for illustrating the method for open-loop and closed-loop control of a rechargeable battery 1 during charging of the rechargeable battery 1.

In order to carry out the method, firstly, in method step S1, the rechargeable battery 1 is connected to the charger 2 such that the corresponding mechanical coupling devices, the electrical connection devices and the communication connections of the rechargeable battery 1 and of the charger 2 are coupled to one another. By means of the coupling of the communication connections of the rechargeable battery 1 and of the charger 2, data and items of information regarding the charging specification or charging parameters, in particular threshold values for a maximum charging current or a maximum charging voltage, are exchanged between the rechargeable battery 1 and the charger 2. As a result of the connection of the electrical connection devices of the rechargeable battery 1 and of the charger 2, electrical energy is conducted from the charger 2 to the rechargeable battery 1, a value for the charging current intensity $I_{C2}$ being adjusted at the charger 2. In this case, the value for the charging current intensity $I_{C2}$ is adjusted by means of a corresponding signal from the rechargeable battery 1 to the charger 2 via the communication connections. The charging voltage $U_{R1}$ at the charging current intensity $I_{C2}$ is detected by means of the voltage measuring device 8 of the rechargeable battery 1. Alternatively, the charging voltage $U_{R1}$ at the charging current intensity $I_{C2}$ can be detected by means of the voltage measuring device 16*b* of the charger 2. The detected value for the charging voltage $U_{R1}$ is stored in the rechargeable battery storage device 10. Alternatively, the detected value for the charging voltage $U_{R1}$ can be stored in the charger storage device 15.

After a first time duration t1 (cf. FIG. 4), and at a method step D1, a first current intensity value $I_{C1}$ for charging the rechargeable battery 1 is adjusted in a second method step S2, the first current intensity value $I_{C1}$ being lower than the charging current intensity value $I_{C2}$. The current intensity value is adjusted by the rechargeable battery control device 12 or, in accordance with an alternative embodiment of the invention, by the charger control device 16.

In this case, the first current intensity value $I_{C1}$ can be 0 A (in words: zero amperes).

The first time duration t1 is 5 to 10 seconds. Furthermore, the temperature of the rechargeable battery 1 and the rechargeable battery voltage or the charging voltage $U_{R2}$ are detected during the second method step S2.

In accordance with an alternative embodiment of the present invention, a first current intensity value $I_{C1}$ for charging the rechargeable battery 1 is not adjusted after a first time duration D1 (or t1 in FIG. 4), but rather after a predetermined temperature value has been reached, after a predetermined current intensity value has been reached, or if the difference between a first and a second ascertained current intensity value reaches a predetermined threshold value.

During the second method step S2, the impedance Z of the rechargeable battery is determined from the quotient of the difference between the first current intensity value $I_{C1}$ and the second current intensity value $I_{C2}$ and the difference between the first voltage value $U_{R1}$ and the second voltage value $U_{R2}$ with the aid of formula F1.

$$Z = \left| (U_{R1} - U_{R2})/(I_{c1} - I_{c2}) \right|$$

Formula F1

After the time duration t2, the second current intensity value $I_{C2}$ is adjusted again to the first current intensity value $I_{C1}$, cf. FIG. 4.

The impedance of the rechargeable battery 1 is directly related to the temperature of the rechargeable battery 1 or the energy storage cells 5 thereof. The temperature is therefore detected by the temperature sensor 9 during the process of determining the impedance in phase P1. With the aid of the control device and the lookup tables for the temperature values stored in the storage device, it is possible to determine the impedance depending on the respectively detected temperature of the rechargeable battery 1. The detected temperature values are stored in the storage device. Alternatively, with the aid of the lookup tables for the temperature values, it is possible to determine a normalized value for the impedance at a temperature of 25° C.

As indicated in FIG. 3, a determination of the impedance Z with the aid of the method described above is carried out at regular time intervals during the entire phase P1 in accordance with one exemplary embodiment of the present invention.

Method step D2 involves deciding whether or not the charging process for the rechargeable battery 1 is intended to be ended. If the charging process is intended to be continued, the impedance Z is determined once again after a further time duration t1.

For the phase P1, the determined values of the impedance are stored in the storage device, such that a certain number of impedance values are present. In method step S3, an average impedance value can be calculated from the multiplicity of determined impedance values, said average impedance value being relatively robust vis-à-vis possible state of charge and temperature dependencies. The use of a multiplicity of calculated average impedance values makes it possible to determine the capacity and performance of the rechargeable battery 1 over the entire period of use of the rechargeable battery.

At method point D3, it is possible to decide whether or not the average impedance value has reached a predetermined impedance threshold value. The predetermined impedance threshold value is stored in the storage device. If the threshold value of the ascertained average impedance has been reached, the capacity and performance of the rechargeable battery 1 are no longer sufficient for a further use as energy supply of a power tool 3. The use, i.e. the charging and discharging of the rechargeable battery 1, can thereupon be blocked by the control device 10 of the rechargeable battery 1.

The above method according to the invention describes a charging process of the rechargeable battery 1 at the charger 2. However, the method according to the invention can also be used for a discharging process of the rechargeable battery 1 as energy supply at a power tool 3. The method during a discharging process of the rechargeable battery 1 is almost identical to the charging process of the rechargeable battery 1. In contrast to the method during the charging process of the rechargeable battery 1, during the discharging process electrical energy passes from the rechargeable battery 1 to the power tool 3.

LIST OF REFERENCE SIGNS

1 Rechargeable battery
2 Charger
3 Power tool
4 Rechargeable battery housing
4*a* Top side of the rechargeable battery housing

4*b* Underside of the rechargeable battery housing
4*c* Front side of the rechargeable battery housing
4*d* Rear side 4*d* of the rechargeable battery housing
5 Energy storage cell
6 Rechargeable-battery interface
7 Current measuring device of the rechargeable battery
8 Voltage measuring device of the rechargeable battery
9 Temperature sensor of the rechargeable battery
10 Rechargeable battery storage device
11 Display and input device
12 Rechargeable battery control device
13 Charger housing
13*a* Top side of the charger housing
13*b* Underside of the charger housing
13*c* Front side of the charger housing
13*d* Rear side of the charger housing
14 Charger interface
15 Charger storage device
16 Charger control device
16*a* Current measuring device
16*b* Voltage measuring device
17 Power connection cable
18 Housing of the power tool
18*a* Top side of the power tool housing
18*b* Underside of the power tool housing
18*c* Front end of the power tool housing
18*d* Back end of the power tool housing
19 Handle
19*a* Upper end of the handle
19*b* Lower end of the handle
20 Tool fitting
21 Drive
22 Transmission
23 Output shaft
24 Control apparatus
25 Tool
26 Base apparatus
27 Power tool interface
28 Activation switch

What is claimed is:

1. A method for open-loop and closed-loop control of a rechargeable battery for supplying a power tool with electrical energy, the rechargeable battery containing at least one energy storage cell, at least one temperature sensor, a current measurer, a voltage measurer and a rechargeable battery controller having at least one rechargeable battery storage, the method comprising the steps of:

adjusting the rechargeable battery from a first state of charge to a second state of charge;

creating a first current intensity value after a first predetermined time duration has elapsed, after a predetermined temperature value has been reached, after a predetermined current intensity value has been reached, or if the difference between a first and a second ascertained current intensity value reaches a predetermined threshold value;

ascertaining a first voltage value after the first current intensity value has been reached;

adjusting a second current intensity value after a second predetermined time duration has elapsed;

ascertaining a second voltage value after the second current intensity value has been reached; and determining a first impedance value of the rechargeable battery from the quotient of the difference between the first and second current intensity values and the difference between the first and second voltage values.

2. The method as recited in claim 1 wherein the first voltage value is ascertained after a third predetermined time duration has elapsed after the first current intensity value has been reached.

3. A rechargeable battery for carrying out the method as recited in claim 1, the rechargeable battery comprising: the at least one energy storage cell, the at least one temperature sensor, the current measurer, the voltage measurer and the rechargeable battery controller having the at least one rechargeable battery storage.

4. A charger for carrying out the method as recited in claim 1, the charger comprising: a charger controller having at least one charger storage.

5. The method as recited in claim 1 wherein the power tool is a rechargeable battery-operated screwdriver.

6. The method as recited in claim 1 wherein the step of adjusting the rechargeable battery from a first state of charge to a second state of charge is done via a charging process, the charging process including electrical energy passing from a charger to the rechargeable battery.

7. The method as recited in claim 1 wherein the step of adjusting the rechargeable battery from a first state of charge to a second state of charge is done via a discharging process, the discharging process including electrical energy passing from the rechargeable battery to the power tool.

8. The method as recited in claim 2 wherein the first predetermined time duration is between 5 and 10 seconds and the third predetermined time duration is between 1 and 5 seconds.

9. The method as recited in claim 1 wherein the at least one energy storage cell includes at least three energy storage cells, the at least three energy storage cells being positioned in three rows, the temperature sensor being positioned between two of the three rows.

10. The method as recited in claim 1 wherein the at least one energy storage cell includes a plurality of energy storage cells and the current measurement device is connected to each of the plurality of energy storage cells.

11. The method as recited in claim 1 including an additional step of comparing the first impedance value with a predetermined impedance threshold value, the step of adjusting the rechargeable battery from the first state of charge to the second state of charge being blocked by the rechargeable battery controller if the first impedance value has reached the predetermined impedance threshold value.

* * * * *